(12) United States Patent
Shah et al.

(10) Patent No.: US 11,398,271 B2
(45) Date of Patent: Jul. 26, 2022

(54) MEMORY DEVICE HAVING A COMPARATOR CIRCUIT

(71) Applicant: Taiwan Semiconductor Manufacturing Company, Ltd., Hsinchu (TW)

(72) Inventors: Jaspal Singh Shah, Ottawa (CA); Atul Katoch, Kanata (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/085,420

(22) Filed: Oct. 30, 2020

(65) Prior Publication Data

US 2021/0201989 A1 Jul. 1, 2021

Related U.S. Application Data

(60) Provisional application No. 62/954,903, filed on Dec. 30, 2019.

(51) Int. Cl.
*G11C 11/418* (2006.01)

(52) U.S. Cl.
CPC ................ *G11C 11/418* (2013.01)

(58) Field of Classification Search
CPC ..... G11C 11/418; G11C 7/062; G11C 11/419; G11C 5/063; G11C 7/1069; G11C 11/413; G11C 7/1006; G11C 7/1039; G11C 7/1048
See application file for complete search history.

(56) References Cited

U.S. PATENT DOCUMENTS

| | | | |
|---|---|---|---|
| 6,378,008 B1 * | 4/2002 | Gradinariu | G11C 7/1006 710/20 |
| 6,693,829 B2 * | 2/2004 | Babudri | G11C 16/28 365/185.2 |
| 6,842,377 B2 | 1/2005 | Takano et al. | |
| 8,218,388 B2 | 7/2012 | Kaneko | |
| 8,238,173 B2 * | 8/2012 | Akerib | G11C 29/34 365/189.15 |
| 8,787,058 B2 * | 7/2014 | Venkataramanan | G11C 15/04 365/49.11 |
| 2003/0086314 A1 * | 5/2003 | Okazawa | G11C 11/1673 365/200 |
| 2010/0037102 A1 | 2/2010 | Chen et al. | |

(Continued)

*Primary Examiner* — Khamdan N. Alrobaie
(74) *Attorney, Agent, or Firm* — Merchant & Gould P.C.

(57) ABSTRACT

A memory device includes a memory array that includes one or more rows of memory cells and one or more columns of memory cells. The comparator circuitry is operably connected to at least one column of memory cells in the one or more columns of memory cells. The comparator circuitry includes a precompute circuit and a select circuit operably connected to the outputs of the precompute circuit. The precompute circuit is operable to precompute a comparison operation to produce a first precompute signal and a second precompute signal. The select circuit is operable to receive a first cell data signal from a memory cell in the column of memory cells. Based at least on the first cell data signal, the select circuit selects either the first precompute signal or the second precompute signal to output from the comparator circuitry as a signal read from the memory cell.

20 Claims, 7 Drawing Sheets

(56) References Cited

U.S. PATENT DOCUMENTS

| | | | |
|---|---|---|---|
| 2013/0258790 A1* | 10/2013 | Seningen | G11C 29/50 365/189.15 |
| 2015/0131383 A1* | 5/2015 | Akerib | G11C 7/1006 365/185.18 |
| 2019/0244660 A1 | 8/2019 | Chen et al. | |

* cited by examiner

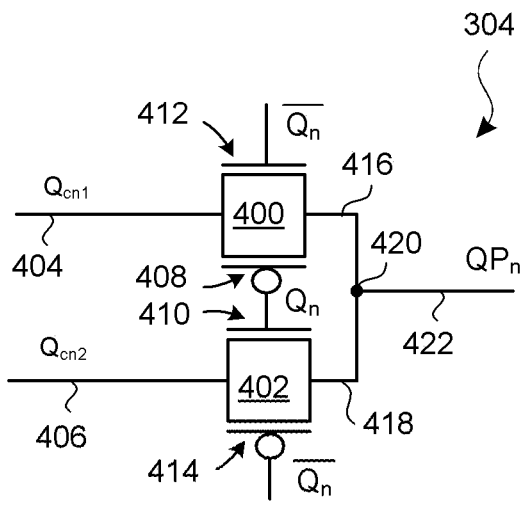
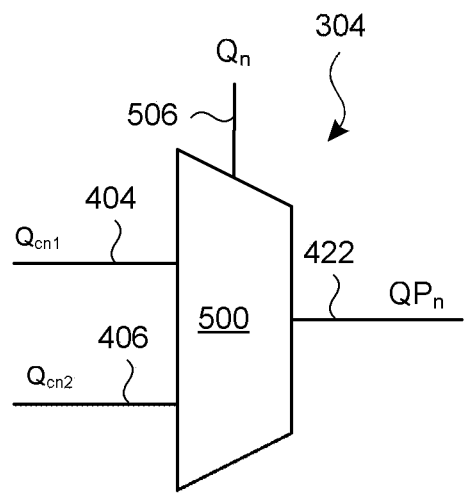
FIG. 4    FIG. 5
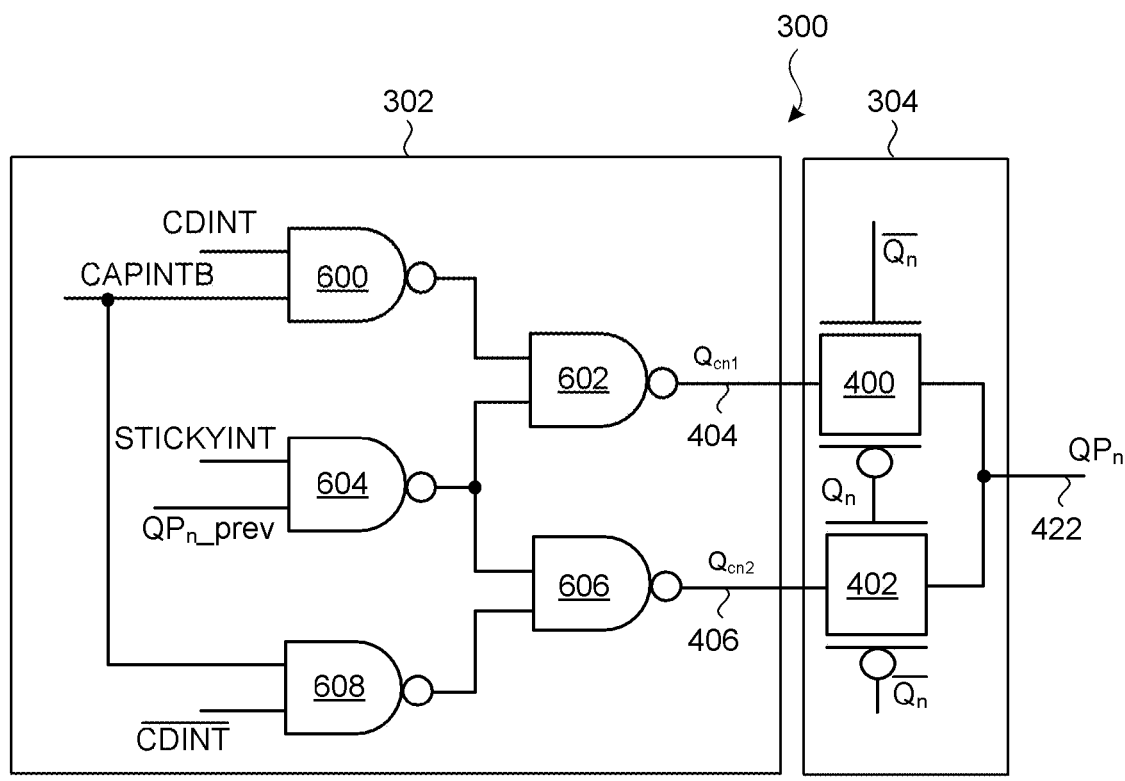
FIG. 6

| Row # | $Q_n$ (700) | $Q_n$ (702) | CDINT (704) | STICKYINT (706) | CAPINTB (708) | $QP_{n\_prev}$ (710) | $Q_{cn1}$ (712) | $Q_{cn2}$ (714) | $QP_n$ when $Q_n=1$ (716) | $QP_n$ when $Q_n=0$ (718) |
|---|---|---|---|---|---|---|---|---|---|---|
| 722 | 1 | 0 | 0 | 0 | 0 | 0 | 0 | 0 | 0 | 0 |
| 724 | 1 | 0 | 0 | 0 | 0 | 1 | 0 | 0 | 0 | 0 |
| 726 | 1 | 0 | 1 | 0 | 0 | 0 | 0 | 0 | 0 | 0 |
| 728 | 1 | 0 | 1 | 0 | 0 | 1 | 0 | 0 | 0 | 0 |
| 732 | 1 | 0 | 0 | 1 | 0 | 0 | 0 | 0 | 0 | 0 |
| 734 | 1 | 0 | 0 | 1 | 0 | 1 | 1 | 1 | 1 | 1 |
| 736 | 1 | 0 | 1 | 1 | 0 | 0 | 0 | 0 | 0 | 0 |
| 738 | 1 | 0 | 1 | 1 | 0 | 1 | 1 | 1 | 1 | 1 |
| 742 | 1 | 0 | 0 | 0 | 1 | 0 | 0 | 1 | 1 | 0 |
| 744 | 1 | 0 | 0 | 0 | 1 | 1 | 1 | 0 | 0 | 0 |
| 746 | 1 | 0 | 1 | 0 | 1 | 0 | 0 | 1 | 1 | 1 |
| 748 | 1 | 0 | 0 | 1 | 1 | 1 | 1 | 0 | 0 | 0 |
| 750 | 1 | 0 | 0 | 1 | 1 | 0 | 0 | 1 | 1 | 1 |
| 752 | 1 | 0 | 1 | 1 | 1 | 1 | 1 | 0 | 0 | 1 |
| 754 | 1 | 0 | 1 | 1 | 1 | 0 | 1 | 1 | 1 | 1 |
| 756 | 1 | 0 | 1 | 1 | 1 | 1 | 1 | 1 | 1 | 1 |

FIG. 7

MEMORY DEVICE HAVING A COMPARATOR CIRCUIT

CROSS-REFERENCE TO RELATED APPLICATION(S)

This application claims priority to U.S. Provisional Application No. 62/954,903 entitled "High Speed Comparator for Pipelined Memories" filed on Dec. 30, 2019, of which the entire disclosure is hereby incorporated by reference in its entirety.

BACKGROUND

Many modern day electronic devices include electronic memory. Electronic memory is a memory device that is configured to store bits of data in memory cells. Presently, many memory devices, such as static random access memory (SRAM) devices, perform data comparison operations prior to outputting signals from the memory device that represent the data stored in the memory cells. The comparison operations are performed once valid output signals are received from the memory array. As such, the comparison operations can consume undesirable amounts of times since the comparison operations have to wait until the valid output signals are received.

Additionally, in some instances, the comparison operations are performed sequentially. Having to wait for a series of valid output signals further increases the amount of time that is consumed by the comparison operations, which in turn adversely impacts the overall operations of the memory device.

BRIEF DESCRIPTION OF THE DRAWINGS

The disclosure will be readily understood by the following detailed description in conjunction with the accompanying drawings, wherein like reference numerals designate like structural elements, and in which:

FIG. 4 depicts a first example of a select circuit in accordance with some embodiments;

FIG. 5 illustrates a second example of a select circuit in accordance with some embodiments;

FIG. 6 depicts an example comparator circuit in accordance with some embodiments;

FIG. 7 illustrates example signal levels for the input signals, the previous memory output signal, the precompute signals, and the memory output signal in accordance with some embodiments;

DETAILED DESCRIPTION

Figure 1:
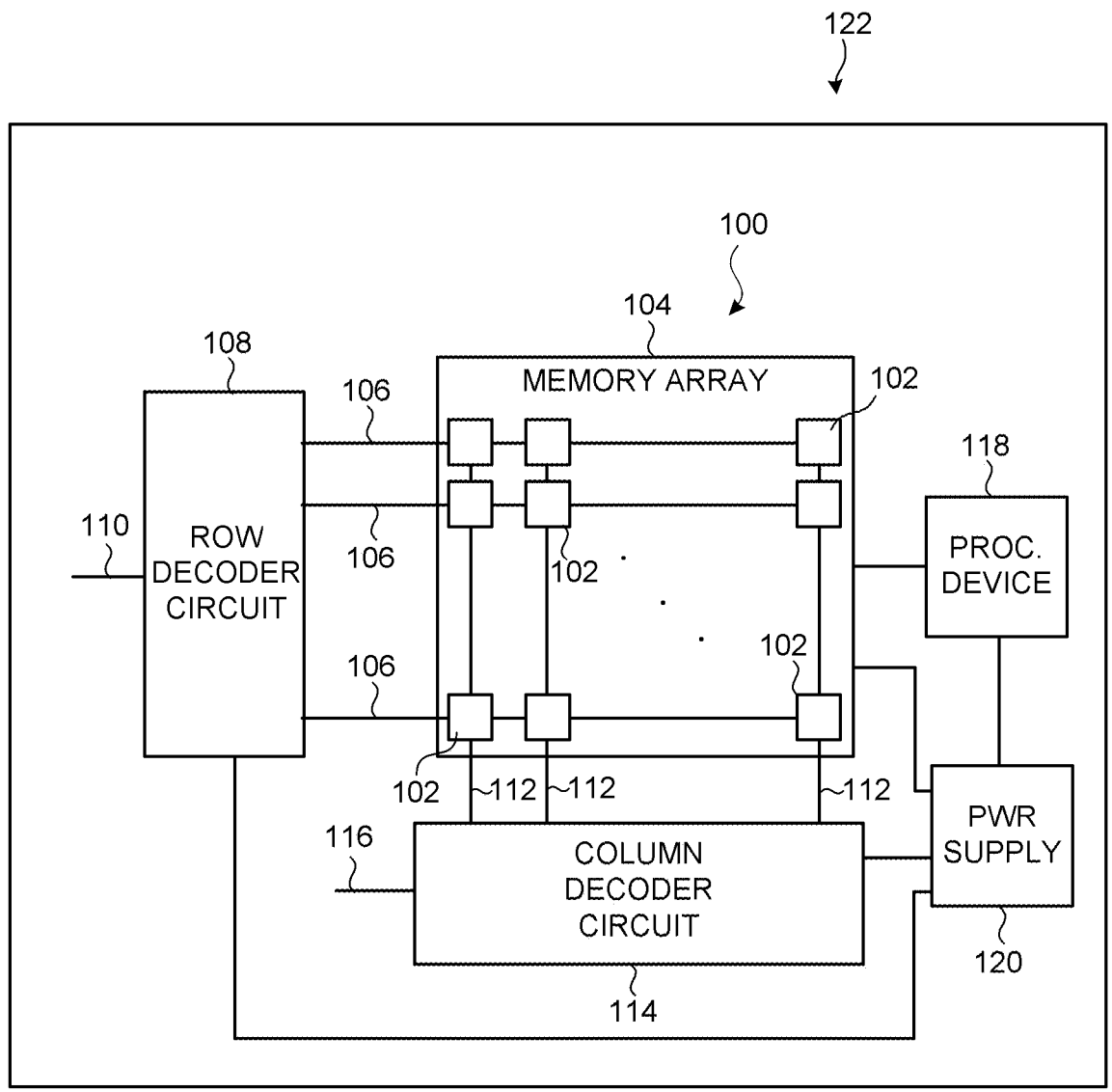
FIG. 1 illustrates a block diagram of a memory device in which aspects of the disclosure may be practiced in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Embodiments described herein provide a pipelined memory that improves the comparison operations at the output of the memory. In embodiments, the comparison calculation is pre-computed, which can improve the overall performance of a memory device because the amount of time for the comparison operation is reduced. Additionally or alternatively, the evaluation of the comparison is performed in a fixed amount of time. One or both of these processes can increase the cycle time of the memory and/or improve the performance of the memory at the system level.

These and other embodiments are discussed below with reference to FIGS. 1-9. However, those skilled in the art will readily appreciate that the detailed description given herein with respect to these Figures is for explanatory purposes only and should not be construed as limiting.

FIG. 1 illustrates a block diagram of a memory device in which aspects of the disclosure may be practiced in accordance with some embodiments. In the illustrated embodiment, the memory device 100 includes memory cells 102 that are arranged in rows and columns to form a memory array 104. The memory device 100 can include any suitable number of rows and columns. For example, a memory device includes R number of rows and C number of columns, where R is an integer greater than or equal to one and C is a number greater than or equal to one. Other embodiments are not limited to rows and columns of memory cells 102. The memory cells 102 in a memory array 104 can be organized in any suitable arrangement.

Each row of memory cells 102 is operably connected to one or more word lines (collectively word line 106). The word lines 106 are operably connected to one or more row decoder circuits (collectively referred to as row decoder circuit 108). The row decoder circuit 108 selects a particular word line 106 based on an address signal that is received on signal line 110.

Each column of memory cells 102 is operably connected to one or more bit lines (collectively bit line 112). The bit lines 112 are operably connected to one or more column decoder circuits (collectively referred to as column decoder circuit 114). The column decoder circuit 114 selects a particular bit line 112 based on a select signal that is received on signal line 116.

A processing device 118 is operably connected to the memory array 104, the row decoder circuit 108, and the column decoder circuit 114. The processing device 118 is operable to control one or more operations of the memory array 104, the row decoder circuit 108, and the column decoder circuit 114. Any suitable processing device can be used. Example processing devices include, but are not limited to, a central processing unit, a microprocessor, an application specific integrated circuit, a graphics processing unit, a field programmable gate array, or combinations thereof.

A power supply 120 is operably connected to the memory array 104, the row decoder circuit 108, the column decoder circuit 114, and the processing device 118. The processing device 118 and/or the power supply 120 can be disposed in the same circuitry (e.g., a macro) as the memory array 104. In an example embodiment, the macro refers to a memory unit that includes the memory array 104 and peripherals such as the control block, input/output block, row decoder circuit 108, column decoder circuit 114, etc. In other embodiments, the processing device 118 and/or the power supply 120 may be disposed in separate circuitry and operably connected to the macro (e.g., the memory array 104).

When data is to be written to a memory cell 102 (e.g., the memory cell 102 is programmed), or is to be read from a memory cell 102, an address for the memory cell 102 is received on signal line 110. The row decoder circuit 108 activates or asserts the word line 106 associated with the address. A select signal is received on the signal line 116 and the bit line 112 associated with the select signal is asserted or activated. The data is then written to, or read from, the memory cell 102.

In the illustrated embodiment, the memory device 100 is included in an electronic device 122. The electronic device 122 can be any suitable electronic device. Example electronic devices include, but are not limited to, a computing or mobile device such as a laptop computer and a tablet, a cellular telephone, a television, an automobile, a stereo system, and a camera.

Figure 2:
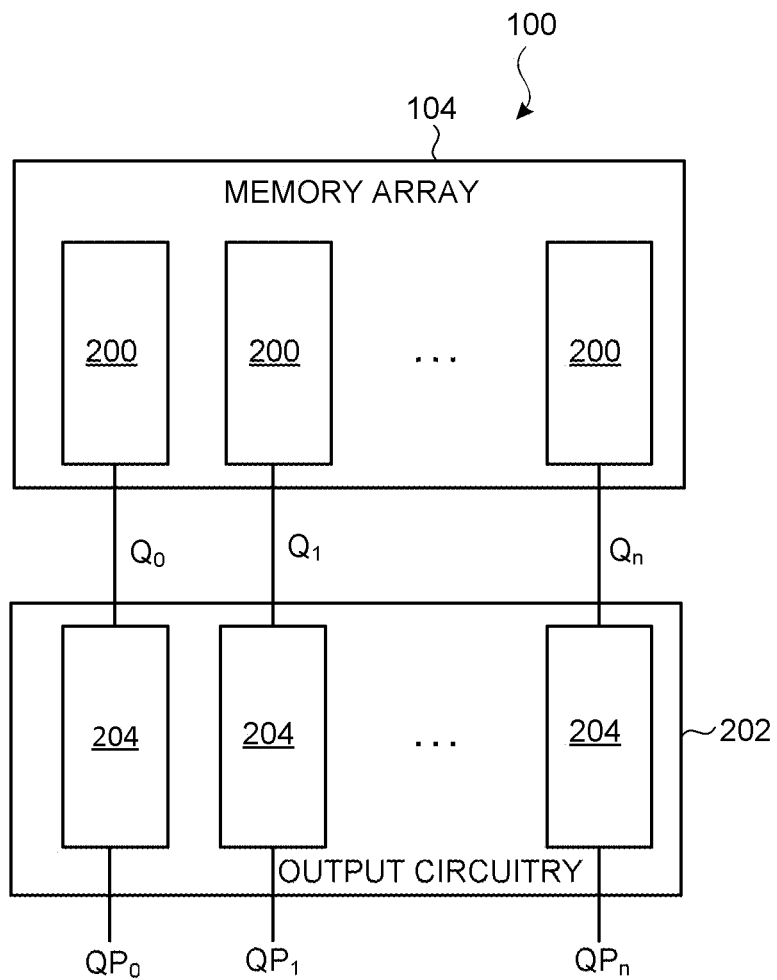
FIG. 2 depicts the memory array shown in FIG. 1 in accordance with some embodiments.

FIG. 2 depicts the memory array shown in FIG. 1 in accordance with some embodiments. In the illustrated embodiment, the memory array 104 is operably connected to output circuitry 202. Each column 200 of memory cells (memory cells 102 shown in FIG. 1) in the memory array 104 is operably connected to a column output circuit 204 in the output circuitry 202. In an example embodiment, the output circuitry 202 is included in the column decoder circuit 114 shown in FIG. 1. Additionally or alternatively, in one embodiment, some or all of the output circuitry 202 is included in the macro with the memory array 104. In other embodiments, all of the output circuitry 202 is not included in the macro with the memory array 104.

Each column output circuit 204 includes comparator circuitry (shown in FIG. 3) for outputting the cell data signal $Q_n$ (e.g., a logic 1 or 0) readout of a particular memory cell 102. The cell data signal $Q_n$ (signals $Q_0, Q_1, \ldots Q_n$) that is read from a particular memory cell in the memory array 104 is received by a respective column output circuit 204. The comparator circuitry in the column output circuit 204 compares the cell data signal $Q_n$ with a reference value to produce the memory output signal $QP_n$ (signals $QP_0, QP_1, \ldots QP_n$). Embodiments of the comparator circuitry are described in more detail in conjunction with FIGS. 3-8. The example comparator circuitry can reduce the amount of time used by a comparison operation, which in turn improves the overall performance of a memory device (e.g., memory device 100 in FIGS. 1 and 2).

Figure 3:
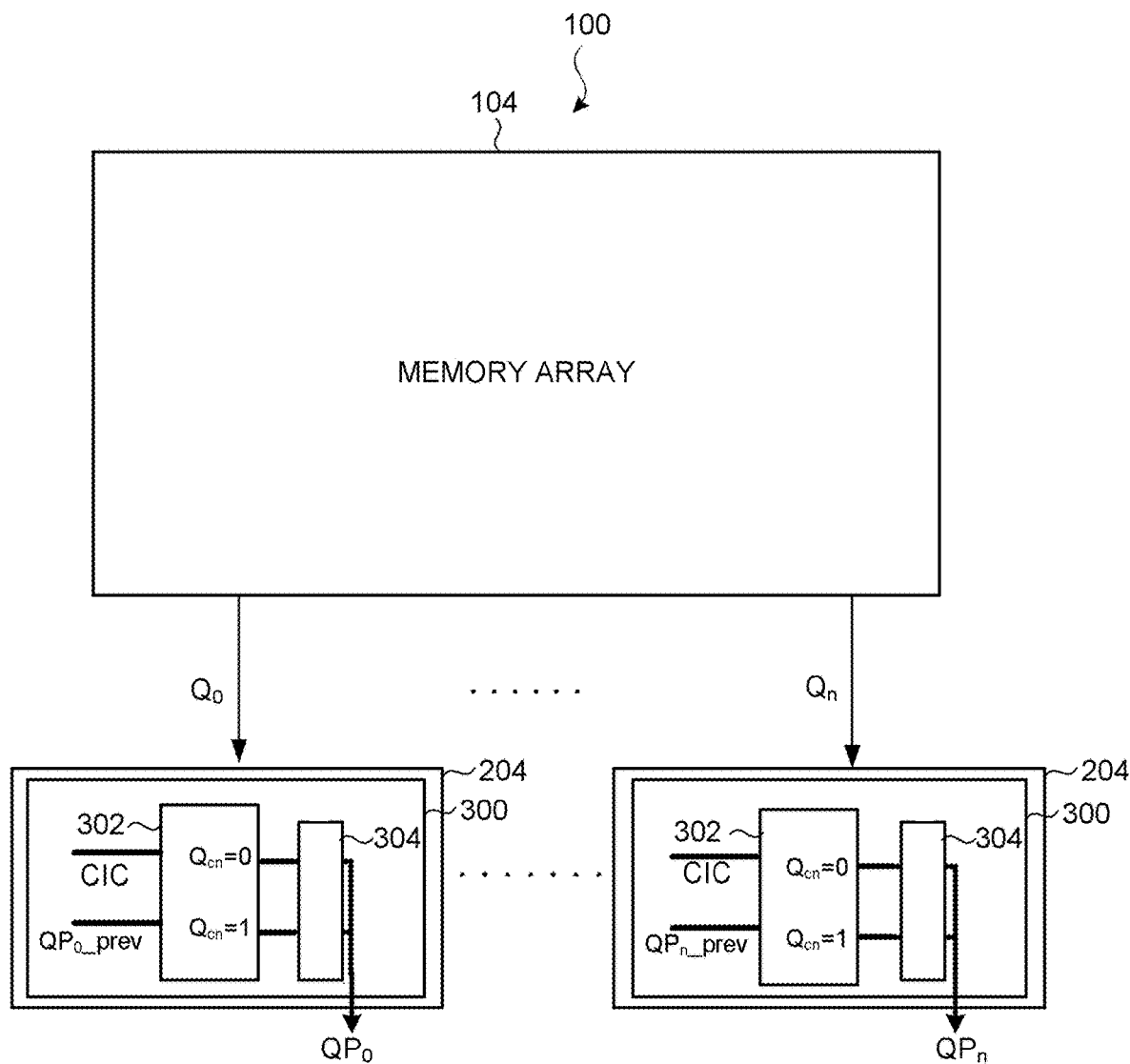
FIG. 3 illustrates the memory array shown in FIG. 2 in accordance with some embodiments.

FIG. 3 illustrates the memory array shown in FIG. 2 in accordance with some embodiments. As described previously, a cell data signal (signal $Q_n$) is obtained from a particular memory cell in the memory array 104 and is received by a respective column output circuit 204. Each column output circuit 204 includes comparator circuitry 300 for comparing the cell data signal (signal $Q_n$) to a known or reference value to determine the memory output signal (signal $QP_n$) for the particular memory cell.

Each comparator circuitry 300 includes a precompute circuit 302 and a select circuit 304. The output(s) of the precompute circuit 302 is operably connected to the input(s) of the select circuit 304. The output of the select circuit 304 is the memory output signal (signal $QP_n$). One input signal to the precompute circuit 302 is the previous memory output signal (signal $QP_{n\_prev}$). Other input signals to the precompute circuit 302 are the compare input signal(s) and the control signal(s) (collectively represented as CIC signal in FIG. 3). In one embodiment, the other input signals include a compare data signal CDINT that provides a data value to be compared, an inverted signal CDINTB of the compare data signal CDINT, a sticky signal STICKYINT that indicates the output is the previous memory output signal (signal $QP_{n\_prev}$), and an inverted signal CAPINTB of an initialization signal CAPINT that initializes the output (e.g., precompute signal $Q_{cn1}$ and precompute signal $Q_{cn2}$) to known values. The other input signals (CIC signal) are known in the art and are external signals that are received as inputs by the precompute circuit 302. For example, in one embodiment, a processing device (e.g., processing device 118 in FIG. 1) and/or circuits in the output circuitry (e.g., output circuitry 202) produce the other input(s). The operations of the precompute circuit 302 and the input signals are described in more detail in conjunction with FIGS. 6 and 7.

Using the input signals CIC and $QP_{n\_prev}$ signal, the precompute circuit 302 precomputes the comparison for a cell data signal (signal $Q_n$). The select circuit 304 uses the cell data signal (signal Q) to select the relevant precompute signal to output as the memory output signal (signal $QP_n$). Each precompute circuit 302 computes a first precompute signal ($Q_{cn1}$) and a second precompute signal ($Q_{cn2}$) for each received cell data signal ($Q_n$). The select circuit 304 selects and outputs either the first precompute signal ($Q_{cn1}$) or the second precompute signal ($Q_{cn2}$) based on the cell data signal (signal $Q_n$).

The select circuit 304 can be implemented with any suitable switch. FIG. 4 depicts a first example of a select circuit in accordance with some embodiments. The select circuit 304 includes a first transmission gate 400 operably connected to a second transmission gate 402. In one embodiment, each transmission gate 400, 402 includes a p-type transistor (e.g., a pMOS transistor) operably connected in parallel with an n-type transistor (e.g., an nMOS transistor).

The first precompute signal (signal $Q_{cn1}$) that is output from the precompute circuit 302 (FIG. 3) is input into the first transmission gate 400 via signal line 404. The second precompute signal (signal $Q_{cn2}$) that is output from the precompute circuit 302 is input into the second transmission gate 402 via signal line 406. The cell data signal (signal $Q_n$) from a particular memory cell is input into the first and the second transmission gates 400, 402 via gates 408, 410 respectively. An inverted signal (signal $\overline{Q}_n$) of the cell data signal (signal $Q_n$) is input into the first and the second transmission gates 400, 402 via gates 412, 414, respectively. In a non-limiting example, the first and the second transmission gates 400, 402 each include an inverter (not shown) that receives the cell data signal (signal $Q_n$) and outputs the inverted cell data signal (signal $\overline{Q}_n$).

The cell data signal and the inverted cell data signal (signals $Q_n$ and $\overline{Q}_n$) act as control signals that are used to select either the first precompute signal (signal $Q_{cn1}$) to output on the first signal line 416 or the second precompute signal (signal $Q_{cn2}$) to output on the second signal line 418. In the illustrated embodiment, the first and the second signal lines 416, 418 are connected together at node 420 to form the signal line 422. As noted earlier, the signal output from the select circuit 304 on the signal line 422 is the memory output signal (signal $QP_n$).

FIG. 5 illustrates a second example of a select circuit in accordance with some embodiments. The select circuit 304 includes a multiplexer 500 that receives the first precompute signal (signal $Q_{cn1}$) from the precompute circuit 302 (FIG. 3) as an input on signal line 502 and the second precompute signal (signal $Q_{cn2}$) from the precompute circuit 302 as an input on signal line 504. The cell data signal (signal $Q_n$) from the memory cell is received by the multiplexer 500 on signal line 506 and is used as a select signal to select either the first precompute signal (signal $Q_{cn1}$) or the second precompute signal (signal $Q_{cn2}$) to output on the signal line 508. Again, as noted earlier, the signal output from the select circuit 304 on the signal line 508 is the memory output signal (signal $QP_n$).

FIG. 6 depicts example comparator circuitry in accordance with some embodiments. As described previously, the comparator circuitry 300 includes the precompute circuit 302 and the select circuit 304. The illustrated precompute circuit 302 includes a first NAND gate 600, a second NAND gate 602, a third NAND gate 604, a fourth NAND gate 606, and a fifth NAND gate 608. The output of the first NAND gate 600 is an input to the second NAND gate 602. The output of the third NAND gate 604 is an input to the second NAND gate 602 and an input to the fourth NAND gate 606. The output of the fifth NAND gate 608 is an input to the fourth NAND gate 606. The output of the second NAND gate 602 is one of the precompute signals (e.g., the first precompute signal $Q_{cn1}$). The output of the fourth NAND gate 606 is the other precompute signal (e.g., the second precompute $Q_{cn2}$). As noted earlier, the first and the second precompute signals ($Q_{cn1}$ and $Q_{cn2}$) are the signals output from the precompute circuit 302.

A first input signal to the first NAND gate 600 is the compare data signal CDINT and a second input signal to the first NAND gate 600 is the inverted initialization signal CAPINTB. A first input signal to the third NAND gate 604 is the STICKYINT signal and a second input signal to the third NAND gate 604 is the previous memory output signal $QP_{n\_prev}$. A first input signal to the fifth NAND gate 608 is the inverted initialization signal CAPINTB and a second input signal to the fifth NAND gate 608 is an inverted signal $\overline{CDINT}$ of the compare data signal CDINT.

In one embodiment, the first and the second precompute signals $Q_{cn1}$ and $Q_{cn2}$ are calculated before the cell data signal $Q_n$ is available. The cell data signal $Q_n$ by itself is used by the select circuit 304 (e.g., FIG. 5) to select either the first or the second precompute signal ($Q_{cn1}$ and $Q_{cn2}$) to output as the memory output signal $QP_n$, or the cell data signal $Q_n$ and an inverted cell data signal $\overline{Q}_n$ are used by the select circuit 304 (e.g., FIG. 4) to select either the first or the second precompute signal ($Q_{cn1}$ and $Q_{cn2}$) to output as the memory output signal $QP_n$. The select circuit 304 illustrated in FIGS. 4 and 6 each outputs the first precompute signal $Q_{cn1}$ when the cell data signal $Q_n$ equals zero (0) and outputs the second precompute signal $Q_{cn2}$ when the cell data signal $Q_n$ equals one (1).

FIG. 7 depicts example signal levels for the input signals, the previous memory output signal, the precompute signals, and the memory output signal in accordance with some embodiments. Each row represents a given set of signal levels for the input signals $Q_n$, the previous memory output signal $QP_{n\_prev}$, the first and the second precompute signals $Q_{cn1}$, $Q_{cn2}$, and the memory output signal $QP_n$. In particular, column 700 shows the signal levels for the cell data signal $Q_n$ as equal to 1 and column 702 lists the signal levels for the cell data signal $Q_n$ as equal to 0. Each cell data signal received from a memory cell is one of the two signal levels (either a one or a zero).

Column 704 shows signal levels for the input signal CDINT, column 706 lists signal levels for the input signal STICKYINT, column 708 depicts signal levels for the input signal CAPINTB, and column 710 shows the signal levels for the input signal $QP_{n\_prev}$. Column 712 lists the signal levels for the first precompute signal $Q_{cn1}$ and column 714 depicts the signal levels for the second precompute signal $Q_{cn2}$. As noted earlier, in one embodiment, the first and the second precompute signals $Q_{cn1}$ and $Q_{cn2}$ are calculated before the cell data signal $Q_n$ is available, and the cell data signal $Q_n$ is used by the select circuit to select which of the first or the second precompute signals ($Q_{cn1}$ or $Q_{cn2}$) is output as the memory output signal $QP_n$.

Column 716 shows respective signal levels of the memory output signal $QP_n$ when the cell data signal $Q_n$ equals 1. Column 718 lists respective signal levels of the memory output signal $QP_n$ when the cell data signal $Q_n$ equals 0. Generally, the signal level of the memory output signal $QP_n$ is independent of, and is not based on, the signal levels of the various input signals and is instead based on the calculation of the first and the second precompute signals $Q_{cn1}$, $Q_{cn2}$ and the signal level of the cell data signal $Q_n$. However, there are two groups of signals where the memory output signal $QP_n$ is related to or based on the signal levels of the input signals STICKYINT and CAPINTB. The first group of signals 720 includes rows 722, 724, 726, 728, where the signal level of the input signal STICKYINT is zero (0) and the signal level of the input signal CAPINTB is zero (0) (see columns 706 and 708). In the first group 720, the signal level of the memory output signal $QP_n$ is zero (0) regardless of the signal levels of the input signals CDINT, STICKYINT, CAPINTB, and $QP_{n\_prev}$. For example, in row 722, the signal level of the input signal CDINT is zero (0), the signal level of the input signal STICKYINT is zero (0), the signal level of the input signal CAPINTB is zero (0), and the signal level of the previous memory output signal $QP_{n\_prev}$ is zero (0). The signal level of the first precompute signal $Q_{cn1}$ is zero (0) and the signal level of the second precompute signal $Q_{cn2}$ is zero (0). In row 722, the signal level of the memory output signal $QP_n$ is zero (0) when the cell data signal $Q_n$ equals one (1) and zero (0).

In row 724 of the first group of signals 720, the signal level of the input signal CDINT is zero (0), the signal level of the input signal STICKYINT is zero (0), the signal level of the input signal CAPINTB is zero (0), and the signal level of the previous memory output signal $QP_{n\_prev}$ is one (1). The signal level of the first precompute signal $Q_{cn1}$ is zero (0) and the signal level of the second precompute signal $Q_{cn2}$ is zero (0). In row 724, the signal level of the memory output signal $QP_n$ is zero (0) when the cell data signal $Q_n$ equals one (1) and zero (0).

In row 726 of the first group of signals 720, the signal level of the input signal CDINT is one (1), the signal level of the input signal STICKYINT is zero (0), the signal level of the input signal CAPINTB is zero (0), and the signal level of the previous memory output signal $QP_{n\_prev}$ is zero (0). The signal level of the first precompute signal $Q_{cn1}$ is zero (0) and the signal level of the second precompute signal $Q_{cn2}$ is zero (0). In row 726, the signal level of the memory output signal $QP_n$ is zero (0) when the cell data signal $Q_n$ equals one (1) and zero (0).

In row 728 of the first group of signals 720, the signal level of the input signal CDINT is one (1), the signal level of the input signal STICKYINT is zero (0), the signal level of the input signal CAPINTB is zero (0), and the signal level of the previous memory output signal $QP_{n\_prev}$ is one (1). The signal level of the first precompute signal $Q_{cn1}$ is zero (0) and the signal level of the second precompute signal $Q_{cn2}$ is zero (0). In row 728, the signal level of the memory output signal $QP_n$ is zero (0) when the cell data signal $Q_n$ equals one (1) and zero (0).

The second group of signals 730 where the memory output signal $QP_n$ is based on the signal levels of the input signals STICKYINT and CAPINTB includes the rows 732, 734, 736, 738, where the signal level of the input signal STICKYINT is one (1) and the signal level of the input signal CAPINTB is zero (0) (see columns 706 and 708). In the second group 730, the signal level of the memory output signal $QP_n$ is dependent on the signal level of the previous memory output signal $QP_{n\_prev}$ regardless of the signal levels of the input signals CDINT, STICKYINT, CAPINTB, and $QP_{n\_prev}$. For example, in row 732, the signal level of the input signal CDINT is zero (0), the signal level of the input signal STICKYINT is one (1), the signal level of the input signal CAPINTB is zero (0), and the signal level of the previous memory output signal $QP_{n\_prev}$ is zero (0). The signal levels of the first and the second precompute signal $Q_{cn1}$, $Q_{cn2}$ are both zero (0), which correspond to the signal level of $QP_{n\_prev}$. In row 732, when the cell data signal $Q_n$ equals one (1) and equals zero (0), the signal level of the memory output signal $QP_n$ corresponds to the signal level of $QP_{n\_prev}$, which is zero (0).

In row 734 of the second group of signals 730, the signal level of the input signal CDINT is zero (0), the signal level of the input signal STICKYINT is one (1), the signal level of the input signal CAPINTB is zero (0), and the signal level of the previous memory output signal $QP_{n\_prev}$ is one (1). The signal levels of the first and the second precompute signal $Q_{cn1}$, $Q_{cn2}$ are both one (1), which correspond to the signal level of $QP_{n\_prev}$. In row 734, when the cell data signal $Q_n$ equals one (1) and equals zero (0), the signal level of the memory output signal $QP_n$ corresponds to the signal level of $QP_{n\_prev}$, which is one (1).

In row 736 of the second group of signals 730, the signal level of the input signal CDINT is one (1), the signal level of the input signal STICKYINT is one (1), the signal level of the input signal CAPINTB is zero (0), and the signal level of the previous memory output signal $QP_{n\_prev}$ is zero (0). The signal levels of the first and the second precompute signal $Q_{cn1}$, $Q_{cn2}$ are both zero (0), which correspond to the signal level of $QP_{n\_prev}$. In row 736, when the cell data signal $Q_n$ equals one (1) and equals zero (0), the signal level of the memory output signal $QP_n$ corresponds to the signal level of $QP_{n\_prev}$, which is zero (0).

In row 738 of the second group of signals 730, the signal level of the input signal CDINT is one (1), the signal level of the input signal STICKYINT is one (1), the signal level of the input signal CAPINTB is zero (0), and the signal level of the previous memory output signal $QP_{n\_prev}$ is one (1). The signal levels of the first and the second precompute signal $Q_{cn1}$, $Q_{cn2}$ are both one (1), which correspond to the signal level of $QP_{n\_prev}$. In row 738, when the cell data signal $Q_n$ equals one (1) and equals zero (0), the signal level of the memory output signal $QP_n$ corresponds to the signal level of $QP_{n\_prev}$, which is one (1).

A third group of signals 740 includes rows 742, 744, 746, 748, 750, 752, 754, 756. In the third group of signals 740, the signal level of the memory output signal $QP_n$ is based on the calculation of the first and the second precompute signals $Q_{cn1}$, $Q_{cn2}$ and the signal level of the cell data signal $Q_n$. For example, in row 742, the signal level of the input signal CDINT is zero (0), the signal level of the input signal STICKYINT is zero (0), the signal level of the input signal CAPINTB is one (1), and the signal level of the previous memory output signal $QP_{n\_prev}$ is zero (0). The signal level of the first precompute signal $Q_{cn1}$ is zero (0) and the signal level of the second precompute signal $Q_{cn2}$ is one (1). In row 742, the signal level of the memory output signal $QP_n$ is one (1) when the cell data signal $Q_n$ equals one (1), and the signal level of the memory output signal $QP_n$ is zero (0) when the cell data signal $Q_n$ equals zero (0).

In row 744 of the third group of signals 740, the signal level of the input signal CDINT is zero (0), the signal level of the input signal STICKYINT is zero (0), the signal level of the input signal CAPINTB is one (1), and the signal level of the previous memory output signal $QP_{n\_prev}$ is one (1). The signal level of the first precompute signal $Q_{cn1}$ is zero (0) and the signal level of the second precompute signal $Q_{cn2}$ is one (1). In row 744, the signal level of the memory output signal $QP_n$ is one (1) when the cell data signal $Q_n$ equals one (1), and the signal level of the memory output signal $QP_n$ is zero (0) when the cell data signal $Q_n$ equals zero (0).

In row 746 of the third group of signals 740, the signal level of the input signal CDINT is one (1), the signal level of the input signal STICKYINT is zero (0), the signal level of the input signal CAPINTB is one (1), and the signal level of the previous memory output signal $QP_{n\_prev}$ is zero (0). The signal level of the first precompute signal $Q_{cn1}$ is one (1) and the signal level of the second precompute signal $Q_{cn2}$ is zero (0). In row 746, the signal level of the memory output signal $QP_n$ is zero (0) when the cell data signal $Q_n$ equals one (1), and the signal level of the memory output signal $QP_n$ is one (1) when the cell data signal $Q_n$ equals zero (0).

In row 748 of the third group of signals 740, the signal level of the input signal CDINT is one (1), the signal level of the input signal STICKYINT is zero (0), the signal level of the input signal CAPINTB is one (1), and the signal level of the previous memory output signal $QP_{n\_prev}$ is one (1). The signal level of the first precompute signal $Q_{cn1}$ is one (1) and the signal level of the second precompute signal $Q_{cn2}$ is zero (0). In row 748, the signal level of the memory output signal $QP_n$ is zero (0) when the cell data signal $Q_n$ equals one (1), and the signal level of the memory output signal $QP_n$ is one (1) when the cell data signal $Q_n$ equals zero (0).

In row 750 of the third group of signals 740, the signal level of the input signal CDINT is zero (0), the signal level of the input signal STICKYINT is one (1), the signal level of the input signal CAPINTB is one (1), and the signal level of the previous memory output signal $QP_{n\_prev}$ is zero (0). The signal level of the first precompute signal $Q_{cn1}$ is zero (0) and the signal level of the second precompute signal $Q_{cn2}$ is one (1). In row 750, the signal level of the memory output signal $QP_n$ is one (1) when the cell data signal $Q_n$ equals one (1), and the signal level of the memory output signal $QP_n$ is zero (0) when the cell data signal $Q_n$ equals zero (0).

In row 752 of the third group of signals 740, the signal level of the input signal CDINT is zero (0), the signal level of the input signal STICKYINT is one (1), the signal level of the input signal CAPINTB is one (1), and the signal level of the previous memory output signal $QP_{n\_prev}$ is one (1). The signal level of the first precompute signal $Q_{cn1}$ is one (1) and the signal level of the second precompute signal $Q_{cn2}$ is one (1). In row 752, the signal level of the memory output signal $QP_n$ is one (1) when the cell data signal $Q_n$ equals one (1), and the signal level of the memory output signal $QP_n$ is one (1) when the cell data signal $Q_n$ equals zero (0).

In row 754 of the third group of signals 740, the signal level of the input signal CDINT is one (1), the signal level of the input signal STICKYINT is one (1), the signal level of the input signal CAPINTB is one (1), and the signal level of the previous memory output signal $QP_{n\_prev}$ is zero (0). The signal level of the first precompute signal $Q_{cn1}$ is one (1) and the signal level of the second precompute signal $Q_{cn2}$ is zero (0). In row 754, the signal level of the memory output signal $QP_n$ is zero (0) when the cell data signal $Q_n$ equals one (1), and the signal level of the memory output signal $QP_n$ is one (1) when the cell data signal $Q_n$ equals zero (0).

In row 756 of the third group of signals 740, the signal level of the input signal CDINT is one (1), the signal level of the input signal STICKYINT is one (1), the signal level of the input signal CAPINTB is one (1), and the signal level of the previous memory output signal $QP_{n\_prev}$ is one (1). The signal level of the first precompute signal $Q_{cn1}$ is one (1) and the signal level of the second precompute signal $Q_{cn2}$ is one (1). In row 756, the signal level of the memory output signal $QP_n$ is one (1) when the cell data signal $Q_n$ equals one (1), and the signal level of the memory output signal $QP_n$ is one (1) when the cell data signal $Q_n$ equals zero (0).

Figure 8:
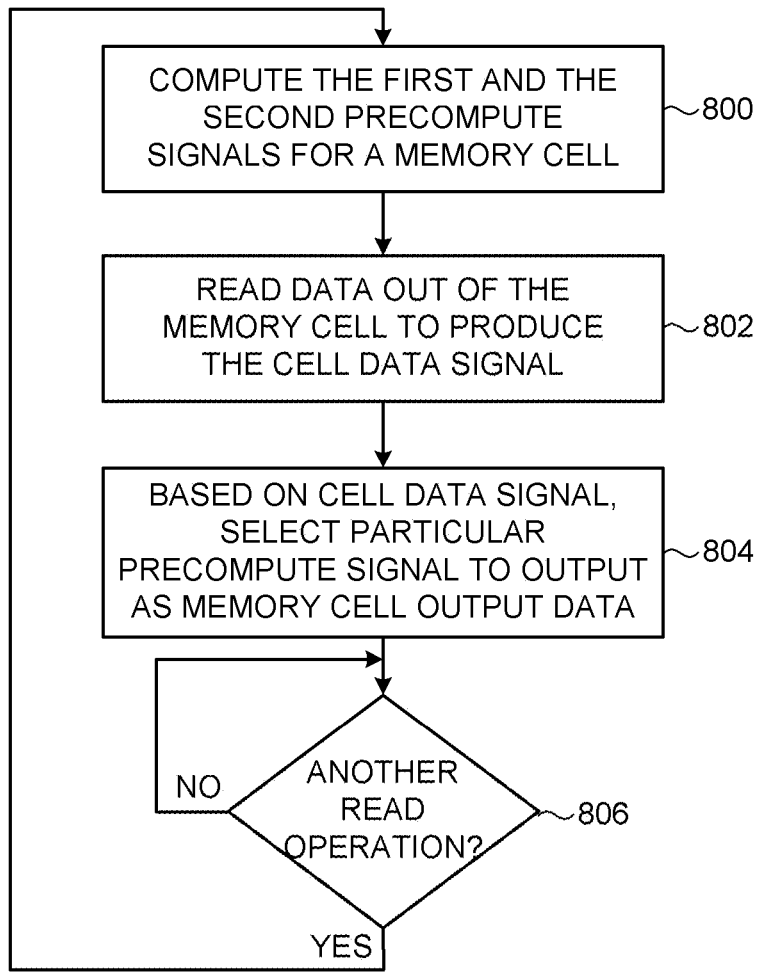
FIG. 8 depicts a flowchart of a method of operating a memory device in accordance with some embodiments.

FIG. 8 illustrates a flowchart of an example method of reading data from a memory cell in accordance with some embodiments. Initially, the first precompute signal (signal $Q_{cn1}$) and the second precompute signal (signal $Q_{cn2}$) for a memory cell are computed at block 800. In the embodiment illustrated in FIG. 6, the first and the second precompute signals $Q_{cn1}$, $Q_{cn2}$ are computed using the input signals CDINT, CAPINTB, STICKYINT, $QP_{n\_prev}$, and CDINTB. Next, as shown in block 802, data is read out of the memory cell to produce the cell data signal (signal $Q_n$). The process then passes to block 804 where, based on the signal level of the cell data signal (e.g., $Q_n=1$ or $Q_n=0$), either the first precompute signal (signal $Q_{cn1}$) or the second precompute signal (signal $Q_{cn2}$) is output from the select circuit as the memory output signal (signal $QP_n$).

In some embodiments, the process of computing and selecting the first precompute signal or the second precompute signal is performed within a fixed amount of time. The amount of time to perform the comparison operation is fixed and is independent of the cell data signal $Q_n$. The comparison operation occurs before the signal level of the cell data signal $Q_n$ is available, and the time to read a memory cell and obtain the cell data signal $Q_n$ can vary (e.g., reading from a memory cell near the start of a row versus reading a memory cell near the end of a row). In prior systems, a larger comparison delay can occur when a memory cell near the end of the row is read. Embodiments disclosed herein reduce or eliminate larger comparison delays by performing the comparison operation within the fixed amount of time.

Next, as shown in block 806, a determination is made as to whether another read operation is to be performed (e.g., another memory cell is to be read). If so, the process returns to block 800 and blocks 800, 802, 804, 806 repeat until the read operations have been performed. When another read operation will not be performed (e.g., the data in another memory cell will not be read), the method waits at block 806 until another read operation is to be performed.

As described earlier, embodiments of the comparator circuitry can reduce the amount of time of a comparison operation because the comparison operation is precomputed. A delay from a clock to an output of the memory (e.g., signal $QP_n$) is defined as tcd_qp=tcd+td_compare_logic, where tcd equals a Clock to Q delay and td_compare_logic is a time delay of the compare logic (e.g., the comparator circuitry 300). Precomputing the first and the second precompute signals Qcn1, Qcn2 can reduce the clock to Q delay, which in turn improves the cycle time and/or the performance of the memory device and/or a pipelined memory system.

Additionally or alternatively, a delay from the clock to an output of the memory (e.g., signal $QP_n$) is defined as tcd_qp=tcd+tdelay_trans_gate, where tcd=Clock to Q delay and tdelay_trans-gate is the time delay of the select circuit (e.g., select circuit 304). In some embodiments, a normalized gate delay to base gate delay is defined as tcd_qp=tcd+(0.5) (Base_gate_delay). The 0.5 value represents the delay of the select circuit. In other embodiments, any suitable value can be used to represent the delay of the select circuit. In some instances, the clock to Q delay (tcd_qp) is reduced, which in turn improves the cycle time and/or the performance of the memory device and/or a pipelined memory system.

Figure 9:
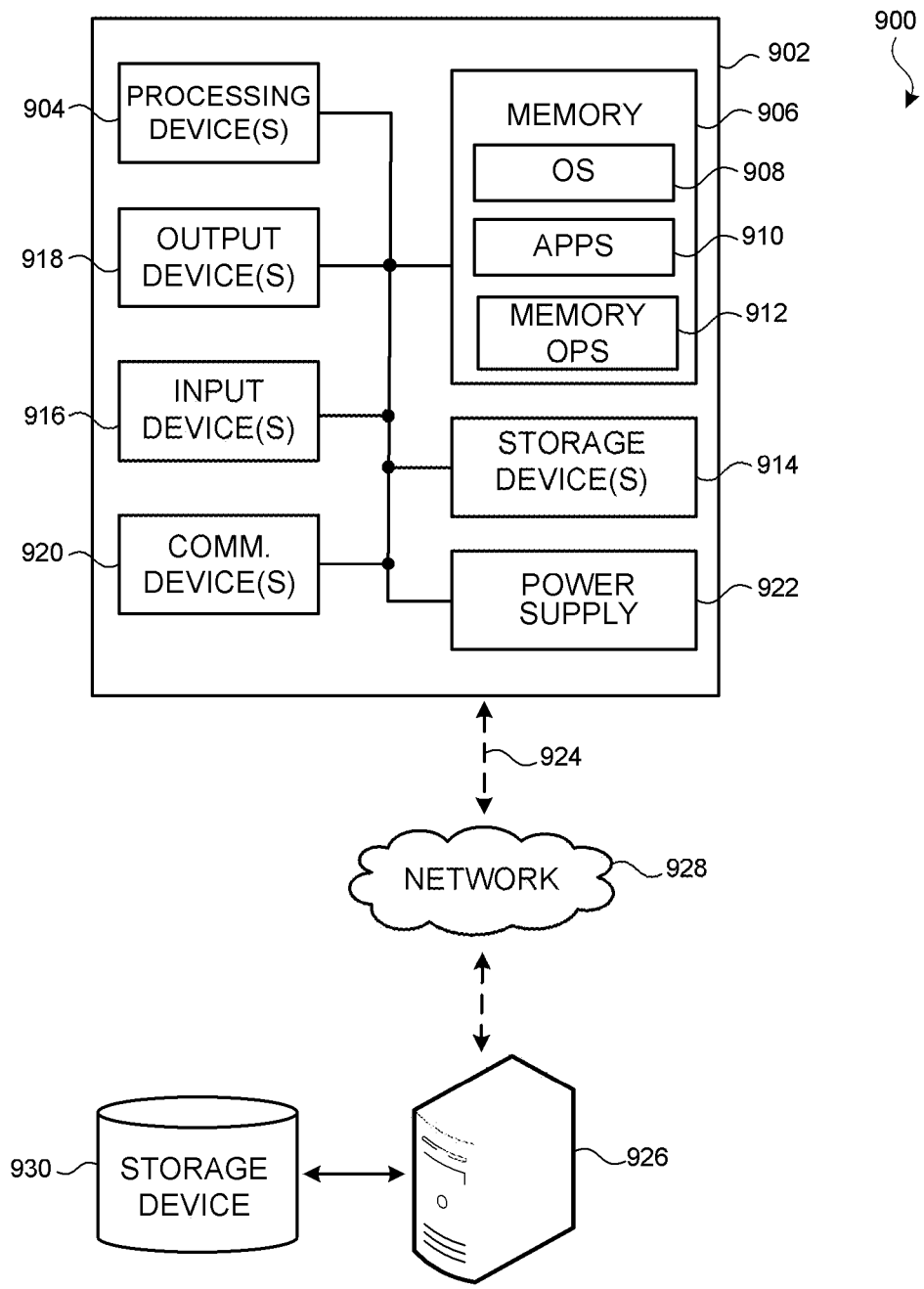
FIG. 9 illustrates an example system that can include one or more memory devices in accordance with some embodiments.

FIG. 9 depicts an example system that can include one or more memory devices in accordance with some embodiments. The system 900 includes an electronic device 902. In an example configuration, the electronic device 902 includes at least one processing device 904 and a system memory device 906. The system memory device 906 may include a number of data files and executable instructions of program modules, such as executable instructions associated with an operating system (OS) 908, one or more software programs (APPS) 910 suitable for parsing received input, determining subject matter of received input, determining actions associated with the input and so on, and memory operations 912 for performing some or all of the memory operations disclosed herein. In one embodiment, the system memory device 906 and/or the storage device 930 stores at least one of the cell data signals, the first and the second precompute signals, and/or the memory output signals. When executed by the processing device(s) 904, the executable instructions may perform and/or cause to be performed processes including, but not limited to, the aspects as described herein.

The OS 908, for example, may be suitable for controlling the operation of the electronic device 902. Furthermore, embodiments may be practiced in conjunction with a graphics library, other operating systems, or any other application program and is not limited to any particular application or system.

The electronic device 902 may have additional features or functionality. For example, the electronic device 902 may also include additional removable and/or non-removable data storage devices 914 such as, for example, magnetic disks, optical disks, tape, and/or memory cards or sticks. The system memory device 906 and/or the data storage device 914 may be implemented as a memory device as disclosed herein. For example, the system memory device 906 and/or the data storage device 914 can be an SRAM device.

The electronic device 902 may also have one or more input devices 916 and one or more output devices 918. Example input device(s) 916 include, but are not limited to, a keyboard, a trackpad, a mouse, a pen, a sound or voice input device, and/or a touch, force and/or swipe input device. The output device(s) 918 can be one or more displays, one or more speakers, a printer, headphones, haptic or tactile feedback device, and the like. The electronic device 902 may include one or more communication devices 920 allowing communications with other electronic devices. Examples communication devices 920 include, but are not limited to, radio frequency (RF) transmitter, receiver, and/or transceiver circuitry (e.g., WiFi), universal serial bus (USB), parallel and/or serial ports, cellular devices, near field communication devices, and short range wireless devices.

The electronic device 902 further includes a power supply 922, which may be implemented as an external power source, such as an AC adapter. Additionally or alternatively, the power supply 922 may include one or more batteries or a powered docking cradle that supplements or recharges the batteries.

The system memory device 906 and the storage device(s) 914 may include, but is not limited to, volatile storage (e.g., random access memory), non-volatile storage (e.g., read-only memory), flash memory, or any combination of such memories. For example, the system memory device 906 and the storage device(s) 914 can each be RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the electronic device 902. In some instances, any such memory or storage device may be part of the electronic device 902 or operably connected to the electronic device 902.

Furthermore, embodiments may be practiced in an electrical circuit comprising discrete electronic elements, packaged or integrated electronic chips containing logic gates, a circuit utilizing a microprocessor, or on a single chip containing electronic elements or microprocessors. For example, embodiments of the disclosure may be practiced via a system-on-a-chip (SOC) where each or many of the components illustrated in FIG. 9 may be integrated onto a single integrated circuit. Such an SOC device may include one or more processing devices, graphics units, communications units, system virtualization units and various application functionality all of which are integrated (or "burned") onto the chip substrate as a single integrated circuit.

When operating via an SOC, the functionality, described herein, with respect to memory operations, may be operated via application-specific logic integrated with other components of the electronic device 902 on the single integrated circuit (chip). Embodiments of the disclosure may also be practiced using other technologies capable of performing logical operations such as, for example, AND, OR, and NOT, including but not limited to mechanical, optical, fluidic, and quantum technologies. In addition, embodiments may be practiced within a general purpose computer or in any other circuits or systems.

In some embodiments, the electronic device 902 optionally accesses (optional connection and access indicated by dashed line 924) one or more server-computing devices (represented by server-computing device 926) through a wired and/or wireless connection to one or more networks (represented by network 928). The server-computing device 926 can interact with various programs or services stored on one or more storage devices (represented by storage device 930) and executed by the server-computing device 926.

In one or more embodiments, the network 928 is illustrative of any type of network, for example, an intranet and/or a distributed computing network (e.g., the Internet). The electronic device 902 can be a personal or handheld computing device or a desktop computing device. For example, the electronic device 902 may be a smart phone, a tablet, a wearable device, a desktop computer, a laptop computer, and/or a server (individually or in combination). This list of electronic devices is for example purposes only and should not be considered as limiting.

Although the figures depict certain components, values, and signal levels, other embodiments are not limited to these components, values, and signal levels. For example, FIG. 6 depicts the precompute circuit 302 as including five NAND gates. Other embodiments are not limited to this implementation and a precompute circuit can be constructed with different types of logic circuits, electrical circuits, and combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, a system includes a memory array and comparator circuitry. The memory array includes one or more rows of memory cells and one or more columns of memory cells. The comparator circuitry is operably connected to a respective column of memory cells in the one or more columns of memory cells. The comparator circuitry includes a precompute circuit and a select circuit operably connected to the outputs of the precompute circuit. The precompute circuit is operable to produce a first precompute signal and a second precompute signal. The select circuit is operable to receive a cell data signal from a memory cell in the respective column of memory cells, and based at least on the cell data signal, select either the first precompute signal or the second precompute signal to output from the comparator circuitry as a memory output signal for the memory cell.

In another aspect, a method of operating a memory device includes precomputing a first precompute signal and a second precompute signal and receiving a cell data signal from a memory cell in the memory device. Based at least on the cell data signal, either the first precompute signal or the second precompute signal is selected to output as a signal read from the memory cell.

In yet another aspect, an electronic device includes a processing device and a memory device operably connected to the processing device. The memory device includes a memory array and comparator circuitry. The memory array includes one or more rows of memory cells and one or more columns of memory cells. The comparator circuitry is operably connected to a respective column of memory cells in the one or more columns of memory cells. The comparator circuitry includes a precompute circuit and a select circuit operably connected to the outputs of the precompute circuit. The precompute circuit is operable to produce a first precompute signal and a second precompute signal. The select circuit is operable to receive a cell data signal from a memory cell in the respective column of memory cells, and based at least on the cell data signal, select either the first precompute signal or the second precompute signal to output from the comparator circuitry as a signal read from the memory cell.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A system, comprising:
a memory array comprising one or more rows of memory cells and one or more columns of memory cells; and
a comparator circuitry operably connected to a respective column of memory cells in the one or more columns of memory cells, the comparator circuitry comprising:
a precompute circuit operable to produce a first precompute signal and a second precompute signal, wherein the precompute circuit being operable to produce the first precompute signal and the second precompute signal comprises the precompute circuit being operable to produce the first precompute signal and the second precompute signal from a previous memory output signal and compare input and control signal before a cell data signal; and
a select circuit operably connected to outputs of the precompute circuit and operable to:
receive the cell data signal from a memory cell in the respective column of memory cells; and
based at least on the cell data signal, select either the first precompute signal or the second precompute signal to output from the comparator circuitry as a memory output signal for the memory cell.

2. The system of claim 1, wherein the select circuit comprises a multiplexer.

3. The system of claim 1, wherein the select circuit comprises a first transmission gate operably connected to a second transmission gate.

4. The system of claim 3, wherein the select circuit is operable to:
receive the cell data signal and an inverted cell data signal; and
based on the cell data signal and the inverted cell data signal, select either the first precompute signal or the second precompute signal to output from the comparator circuitry.

5. The system of claim 1, wherein the precompute circuit comprises:
a first NAND gate;
a second NAND gate, wherein an output of the first NAND gate is a first input into the second NAND gate and an output of the second NAND gate is the first precompute signal;
a third NAND gate, wherein an output of the third NAND gate is a second input into the second NAND gate;
a fourth NAND gate, wherein the output of the third NAND gate is a first input into the fourth NAND gate and an output of the fourth NAND gate is the second precompute signal; and
a fifth NAND gate, wherein an output of the fifth NAND gate is a second input into the fourth NAND gate.

6. The system of claim 1, wherein a signal level of the memory output signal is dependent on a signal level of the previous memory output signal.

7. The system of claim 1, wherein the memory array is included in a static random access memory device.

8. A method of operating a memory device, the method comprising:
precomputing a first precompute signal and a second precompute signal;
receiving a first cell data signal from a first memory cell in the memory device;
based at least on the cell data signal, selecting either the first precompute signal or the second precompute signal to output as a signal read from the first memory cell;
determining if a second memory cell is to be read; and
based on determining that the second memory cell is to be read:
receiving a second cell data signal from the second memory cell, and
based at least on the second cell data signal, selecting either the first precompute signal or the second precompute signal to output as the signal read from the second memory cell.

9. The method of claim 8, wherein the first and the second precompute signals are computed using a previous signal read from the memory cell and a plurality of input signals.

10. The method of claim 8, the method further comprises:
receiving an inverted cell data signal; and
based on the cell data signal and the inverted cell data signal, selecting either the first precompute signal or the second precompute signal to output as the signal read from the memory cell.

11. The method of claim 8, wherein the first memory cell comprises a static random access memory cell.

12. An electronic device, comprising:
a processing device; and
a memory device operably connected to the processing device, wherein the memory device comprises:
a memory array comprising one or more rows of memory cells and one or more columns of memory cells; and
comparator circuitry operably connected to a respective column of memory cells in the one or more columns of memory cells, the comparator circuitry comprising:
a precompute circuit operable to produce a first precompute signal and a second precompute signal, wherein the precompute circuit being operable to produce the first precompute signal and the second precompute signal comprises the precompute circuit being operable to produce the first precompute signal and the second precompute signal from a previous memory output signal and compare input and control signal before a cell data signal; and a select circuit connected to outputs of the precompute circuit and operable to:

receive the cell data signal from a memory cell in the respective column of memory cells; and based at least on the cell data signal, select either the first precompute signal or the second precompute signal to output from the comparator circuitry as a signal read from the memory cell.

13. The electronic device of claim 12, wherein the select circuit comprises a multiplexer.

14. The electronic device of claim 12, wherein the select circuit comprises a first transmission gate operably connected to a second transmission gate.

15. The electronic device of claim 14, wherein the select circuit is operable to:

receive the cell data signal and an inverted cell data signal; and based on the cell data signal and the inverted cell data signal, select either the first precompute signal or the second precompute signal to output from the comparator circuitry.

16. The electronic device of claim 12, wherein the precompute circuit comprises:

a first NAND gate;

a second NAND gate, wherein an output of the first NAND gate is a first input into the second NAND gate and an output of the second NAND gate is the first precompute signal;

a third NAND gate, wherein an output of the third NAND gate is a second input into the second NAND gate;

a fourth NAND gate, wherein the output of the third NAND gate is a first input into the fourth NAND gate and an output of the fourth NAND gate is the second precompute signal; and a fifth NAND gate, wherein an output of the fifth NAND gate is a second input into the fourth NAND gate.

17. The electronic device of claim 12, wherein a signal level of the signal read from the memory cell is dependent on a signal level of a previous signal read from the memory cell.

18. The electronic device of claim 12, wherein the memory device comprises a static random access memory device.

19. The electronic device of claim 12, wherein the electronic device comprises a mobile device.

20. The method of claim 12, wherein a signal level of the signal read from the first memory cell is dependent on a signal level of a previous memory output signal.

* * * * *

UNITED STATES PATENT AND TRADEMARK OFFICE
CERTIFICATE OF CORRECTION

PATENT NO. : 11,398,271 B2
APPLICATION NO. : 17/085420
DATED : July 26, 2022
INVENTOR(S) : Jaspal Singh Shah It is certified that error appears in the above-identified patent and that said Letters Patent is hereby corrected as shown below:

In the Specification

Column 4, Line 49: "(signal Q)" should read --(signal $Q_n$)--

Column 5, Line 6: "(signal $Q_n$)" should read --(signal $\overline{Q}_n$)--

Column 5, Line 12: "(signal $Q_n$)." should read --(signal $\overline{Q}_n$).--

Column 5, Line 14: "(signals $Q_n$ and $Q_n$)" should read --(signals $Q_n$ and $\overline{Q_n}$)--

In the Claims

Column 16, Line 23, Claim 20: "method of claim 12," should read --method of claim 8,--

Signed and Sealed this
Fifth Day of November, 2024

Katherine Kelly Vidal
*Director of the United States Patent and Trademark Office*